(12) United States Patent
Kawabata et al.

(10) Patent No.: US 7,335,031 B2
(45) Date of Patent: Feb. 26, 2008

(54) ACTUATOR

(75) Inventors: Tomohiro Kawabata, Tokyo (JP); Hideki Sunaga, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 631 days.

(21) Appl. No.: 10/894,502

(22) Filed: Jul. 19, 2004

(65) Prior Publication Data

US 2005/0046288 A1    Mar. 3, 2005

(30) Foreign Application Priority Data

Aug. 29, 2003   (JP) .............................. 2003-306234

(51) Int. Cl.
*H01R 12/00*    (2006.01)
(52) U.S. Cl. ...................... 439/76.1; 439/926
(58) Field of Classification Search ............... 439/76.1, 439/76.2, 926

See application file for complete search history.

(56) References Cited

U.S. PATENT DOCUMENTS 5,803,355 A  *  9/1998  Ureshino et al. ............. 236/13
6,028,384 A       2/2000  Billman et al. ............... 310/83
6,099,325 A  *  8/2000  Parkhill ...................... 439/76.1
7,070,117 B2 *  7/2006  Kook ........................ 236/74 R
2002/0068520 A1  6/2002  Joon ......................... 454/121

FOREIGN PATENT DOCUMENTS

DE        101 01 609        7/2002
JP        05-095177         4/1993

* cited by examiner

*Primary Examiner*—Truc T. Nguyen
*Assistant Examiner*—X. Chung-Trans
(74) *Attorney, Agent, or Firm*—J.C. Patents

(57) ABSTRACT

An actuator includes a lower housing member, an upper housing member ached to the lower one, and a cover member. Inside the lower housing member are arranged a driving source, a power-transmitting mechanism configured for transmitting a driving powder of the driving source to a output shaft to which a member to be driven is to be attached, a connector having terminals projected therefrom. A partition plate is provided in the upper housing member and has an opening for exposing said terminals of the connector and adapted to define a partition chamber opened to outside. A circuit board is placed on the partition plate, and has connection terminals connected to the terminals of the connector with a solder on the partition plate. A control circuit is assembled into the circuit board for the driving source. The cover member covers the circuit board.

4 Claims, 2 Drawing Sheets

ACTUATOR

BACKGROUND OF THE INVENTION (1) Field of the Invention

The present invention relates to an actuating device, particularly to an actuator suitably used for an air conditioner in a vehicle.

(2) Related Art Statement

Heretofore, the air conditioner for controlling the temperature of a vehicle compartment, for example, is assembled with an air-mixing door for adjusting a mixed amount of cooled air and warmed air as well as an actuator for driving the air-mixing door.

The actuator comprises an upper housing member and a lower housing member. In the lower housing member, there are arranged a driving source, a circuit board for controlling operation of the driving source, a power-transmission mechanism for transmitting driving power of the driving source to an output shaft to which an air-mixing door is attached, a connector to which electric wires from the driving source are connected, a power input connector to which electric wires from a vehicle body are connected, etc.

When the actuator is to be assembled, the driving source, the power-transmitting mechanism and the connectors are arranged inside the lower housing member, and the circuit board is assembled into the lower housing member by soldering the terminals of the connectors to respective connection terminals of the circuit board. Then, the upper housing member is attached to the lower housing member.

When the terminals of the connectors are to be soldered to the respective connection terminals of the circuit board, an insulating flux is used as an auxiliary agent for facilitating the soldering work and assuredly fixing the solder to the circuit board. See JP-A 5-95177 (Page 2, FIG. 1), for example.

However, when the terminals of the connectors are soldered to the respective connection terminals of the circuit board in the state that the circuit board is arranged inside the lower housing member, it is likely that solder balls and insulating flux scattering during soldering come in the lower housing member, because the circuit board is arranged inside the lower housing member without being isolated therein.

When the actuator is assembled in the state that the solder balls are present inside the lower housing member, the balls may be caught by driving portions of the power-transmitting mechanism, etc., resulting in operational disorder.

Further, if the scattered insulating flux attaches to a conductive portion of such as the connector, the flux-attached conductive portion becomes insulated, which may cause insufficient electric contact.

In order to prevent invasion of the solder balls into the lower housing member and attachment of the flux to the conductive portion, it is a conventional practice that a invasion-preventing cover is placed over the driving source, the power-transmitting mechanisms, etc. arranged in the lower housing member during soldering or the circuit board is cleaned after soldering so as to remove excess solder remaining on the circuit board. According to these techniques, the number of steps increases and thus the production cost rises, although it is possible to prevent the operational disorder due to the solder balls being caught by the driving portion of the power-transmission mechanism, etc. and the insufficient electrical contact due to the attachment of the flux.

SUMMARY OF THE INVENTION

It is therefore an object of the present invention to provide an actuator which makes it possible to suppress increase in the number of production steps and prevent invasion of solder balls and flux scattered during soldering into the lower housing member.

In order to solve the above problem, the actuator according to the present invention comprises An actuator comprising a lower housing member, an upper housing member attached to said lower housing member, a cover member, a driving source, a power-transmission mechanism configured for transmitting a driving powder of said driving source to a output shaft to which a member to be driven is to be attached, a connector having terminals projected therefrom, said driving source and said power-transmission mechanism and said connector being arranged in the lower housing member, a partition plate provided in said upper housing member, having an opening for exposing said terminals of the connector and adapted to define a partition chamber opened to outside, and a circuit board having connection terminals connected to said terminals of the connector with a solder on said partition plate and having a control circuit assembled thereinto for said driving source, said cover member covering said circuit board.

According to the actuator of the present invention, the partition chamber is defined in the upper housing member in such a manner that the partition chamber is opened outside the upper housing member, and the circuit board is arranged on the partition plate defining the partition chamber.

Since the partition plate can be served to function as a conventional invasion-preventing cover, scattering solder balls and flux can be prevented from entering the lower housing member, while the driving source, the power-transmitting mechanism, etc. inside the lower housing member need not be covered with the conventional invasion-preventing cover during soldering or the circuit board needs not be cleaned after soldering. Further, since the number of producing steps is reduced, increase in the production cost can be suppressed.

In a preferred embodiment of the present invention, said partition chamber is defined by said partition plate and a partition wall rising from said partition plate, and the partition chamber is closed with the cover member.

By this construction, the partition chamber is opened outside the upper housing member, and defined by the partition plate and the partition wall rising from the partition plate. This construction makes it possible that the partition plate and the partition wall function in cooperation with each other as the conventional invasion-preventing cover, and that the scattering solder balls and flux can be more assuredly prevented from entering the lower housing during soldering.

Since the partition chamber is closed with the cover member in the state that the cover member is attached to the partition chamber, the cover member functions similarly with the conventional housing in which the driving source, the power-transmitting mechanism, etc. are housed by the lower housing member and the upper housing member in cooperation with each other. Furthermore, when the cover member is attached to the partition chamber dust, etc. can be prevented from attaching to the circuit board arranged on the partition plate.

According to the present invention, the partition chamber is defined in the upper housing member by the partition plate and the partition wall, and the circuit board is arranged on the partition plate. According to this construction, since the partition plate and the partition wall can be served as the invasion-preventing cover, solder balls and flux scattered during soldering can be prevented from entering the lower housing member, while the driving source, the power-transmitting mechanism, etc. arranged inside the lower housing member need not be covered with the conventional invasion-preventing cover during soldering or the circuit board needs not be cleaned after soldering. Further, since the number of producing steps can be reduced, increase in the production cost can be suppressed.

BRIEF DESCRIPTION OF THE DRAWINGS

For a better understanding of the invention, reference is made to the attached drawings, wherein.

DETAILED DESCRIPTION OF THE INVENTION

The present invention will be explained in more detail with reference to one embodiment of an actuator 10 of the present invention shown in FIGS. 1 and 2, which is merely illustrative of the invention but not intended to limit the scope of the claimed invention.

The actuator to which is embodied the present invention is assembled into an air conditioner for controlling the temperature of a vehicle compartment.

Although not illustrated but conventionally well known, the actuator 10 according to the present invention is used as an actuating apparatus for operating an air-mixing door 11 as a member to be driven in an air passage of the air conditioner so as to adjust a mixed ratio between exterior air cooled with a heat exchanger provided in the air conditioner and air warmed through a heater core using engine-cooling water as a heat source.

Figure 1:
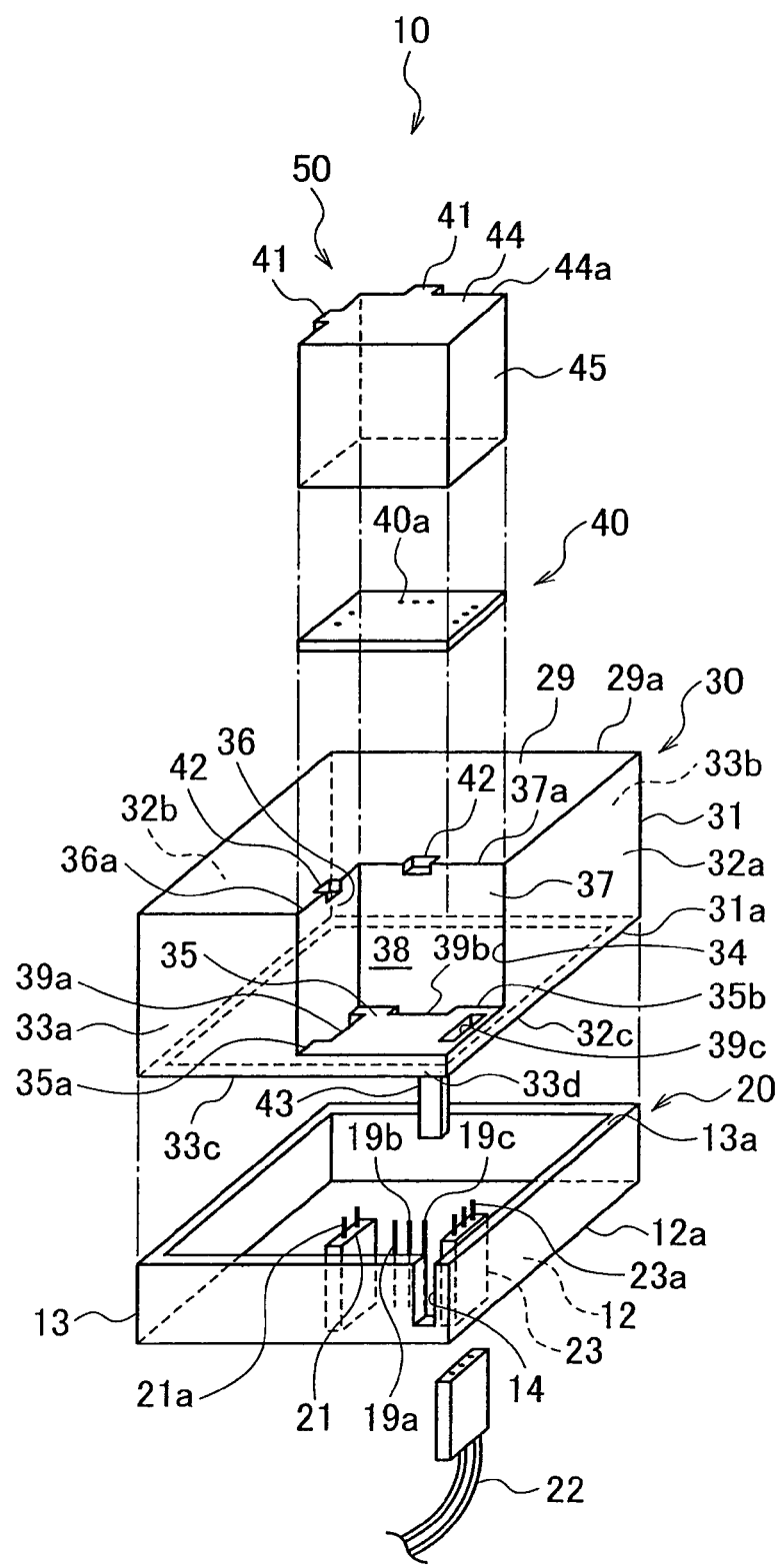
FIG. 1 is an exploded perspective view of schematically illustrating an actuator according to one embodiment of the present invention.

FIG. 1 is an exploded perspective view of schematically illustrating the actuator 10. As shown in FIG. 1, the actuator 10 comprises a lower housing member 20, an upper housing member 30 to be attached to the lower housing member 20, a circuit board 40 and a cover member 50.

The lower housing member 20 comprises a bottom wall 12 and a peripheral wall 13 rising perpendicularly from a peripheral edge 12a of the bottom wall. As shown in FIGS. 1 and 2, the peripheral wall 13 is formed with a rectangular cutaway portion 14 extending from an upper edge 13a of the peripheral wall toward a bottom wall 12.

Figure 2:
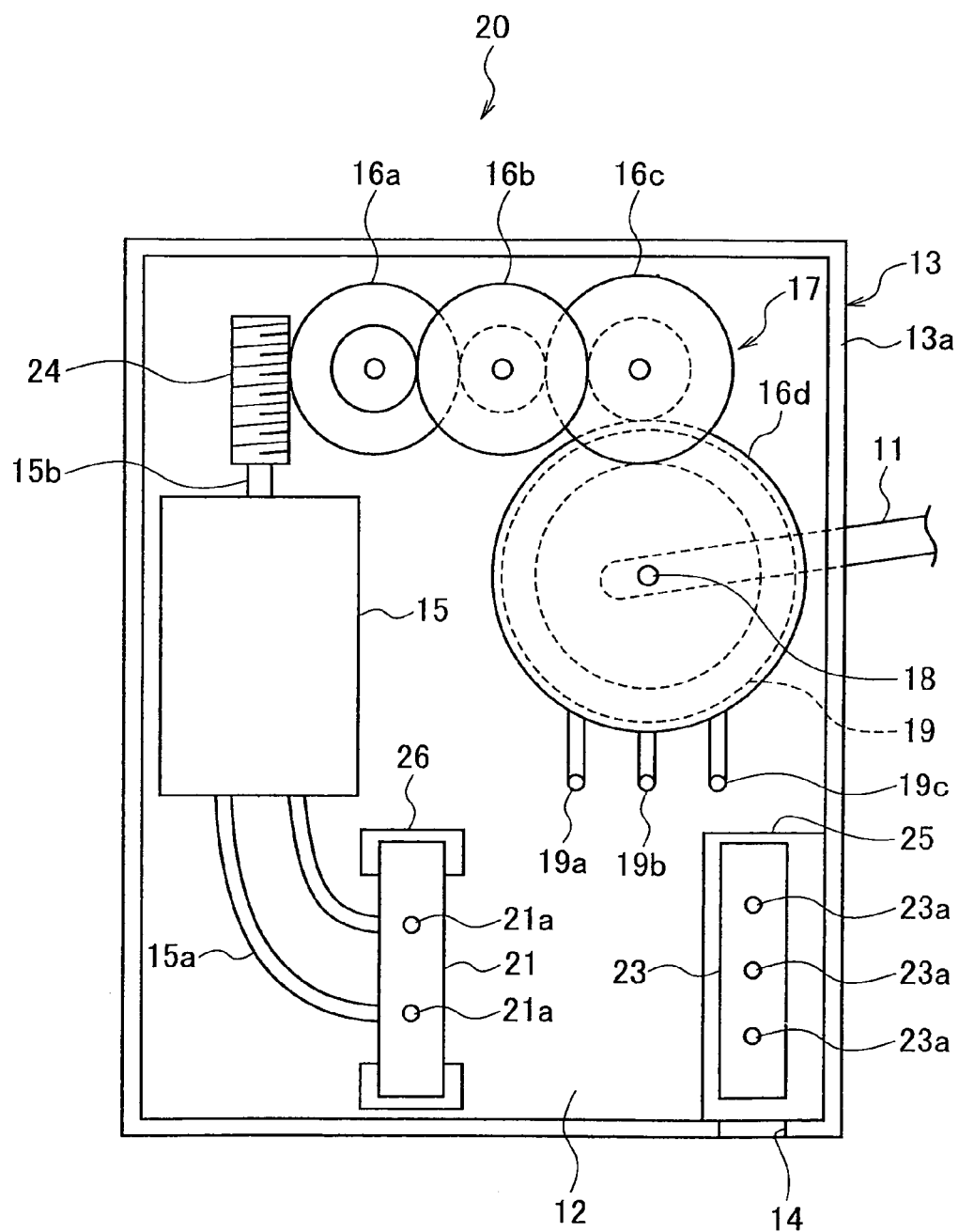
FIG. 2 is a plane view of schematically illustrating a lower housing member of the above embodiment of the present invention in which a driving source, a power-transmitting mechanism, etc. are arranged.

As also shown in FIG. 2, inside the lower housing member 20 are arranged a motor 15 as a driving source of the actuator 10, a power-transmitting mechanism 17 constituted by a row of gears 16a, 16b, 16c and 16d for transmitting the rotation of the motor 15 via a worm gear 24 fixed to a rotary shaft 15b thereof and reducing the rotation, an output shaft 18 which is a rotary shaft for the final-stage gear 16d of the power-transmitting mechanism and to which an air-mixing door 11 is fixed, a potentiobalance resistor 19 (hereinafter referred to as PBR), a motor connector 21 to which electric wires 15a from the motor 16 are connected and a power input connector 23 to which electric wires 22 (See FIG. 1) from a vehicle body are connected.

As mentioned latter in detail, the motor connector 21, the power input connector 23 and the PBR 19 are connected to a circuit board 40 arranged in an upper housing member 30.

The motor connector 21 is provided with a pair of projecting terminals 21a to which electric wires 15a of the motor 15 are connected. The connector 21 is arranged inside the lower housing member 20 together with the terminals 21a in the state that the connector 21 is supported by a support 26 provided inside the lower housing member 20, while the connector 21 projects upwardly out of the lower housing member 20 together with the terminals 21a.

The power input connector 23 has three projecting terminals 23a in the illustrated embodiment, and is received in a housing portion 25 inside the lower housing member 20, while the connector 23 projects upwardly out of the lower housing member 20 together with the terminals 23a. The electric wires 22 from the vehicle body are connected to the power input connector 23 through an opening (not shown) formed in the bottom wall 12 of the lower housing member 20.

A rotation position or a rotation angle of the mixing door 11 is detected by the PBR 19. The PBR 19 is arranged between the final-stage gear 16d and the bottom wall 12 of the lower housing member 20, and has three terminals 19a, 19b and 19c projecting upwardly out of the lower housing member 20. As well known heretofore, voltage corresponding to the rotation angle of the air-mixing door 11 is outputted as an electric signal to the central terminal 19b, while voltage is applied to the opposite side terminals 19a and 19c.

The circuit board 40 to be arranged in the upper housing member 30 has connection terminals 40a to which the terminals 21a of the motor connector 21, the terminals 23a of the power input connector 23 and the terminals 19a, 19b and 19c of the PBR 19 are connected, respectively.

As well known heretofore, when a temperature control level (not shown) provided in the vehicle compartment is operated, an electric signal representing a target value of the rotation angle of the air-mixing door 11 that corresponds to the location of the operated temperature control lever is inputted to the power input connector 23 via the electric wire 22 from the vehicle compartment.

The circuit board 40 receives the electric signals representing the target value from the terminals 23a of the power input connector 23 and the electric signal from the terminal 19b of the PBR 19, determines a difference between the target value and the rotation angle of the air-mixing door 11 detected by the PBR 19 based on these electric signals, and feedback controls the operation of the motor 15 via the motor connector 21 by means of a control circuit (not shown) so that the detected value may be in coincidence with the target one.

As mentioned above, the air-mixing door 11 attached to the output shaft 18 is controlled to an angle corresponding to the target value of the temperature control lever by the feedback control based on the control signal.

As shown in FIG. 1, the upper housing member 30 on which is arranged the circuit board includes a top wall 29, and a peripheral wall 31 downwardly extending from a peripheral edge 29a of the top wall.

When the upper housing member 30 is attached to the lower housing member 20, a lower edge 31a of the peripheral wall 31 can be butted to an upper edge 13a of the peripheral wall 13 of the lower housing member 20. Further, the peripheral wall 31 is designed at such a height that the motor 15, the power-transmitting member, etc. placed in the lower housing member 20 may be sufficiently housed inside the assembly of the lower housing member 20 and the upper housing member 30 in combination in the state that both the housing members are attached together.

The peripheral wall 31 is constituted by a pair of long-side wall portions 32a and 32b and a pair of short-side wall portions 33a and 33b. At an end portion 33d of a lower edge 33c of the short-side wall portion 33a is formed with a rectangularly projecting plate portion 43 extending in a direction away from the top wall 29.

At one of four corners on a side of the top wall 29 is formed an opened area 34 opened outside the upper housing member 30. That portion of the top wall 29 which defines the corner formed with the opened area 34 is cut away in a rectangular shape. Similarly, a part of each of the long-side wall portion 32a and the short-side wall portion 33a which define that corner is cut away in a rectangular shape, leaving their respective lower edges 32c and 33c.

Inside the opened area 34 is formed a rectangular partition plate 35 which continues to the uncut lower edge 33c of the short-side wall portion 33a and the uncut lower edge 32c of the long-side wall portion 32a and extends as a bottom wall of the opened area in parallel to the top wall 29 inside the opened area 34.

The partition plate 35 is formed with openings 39a, 39c and 39b corresponding to the motor connector 21, the power input connector 23 and the terminals 19a, 19b and 19c of the PBR 19, respectively. The openings have such dimensions as to allow the connectors 21 and 23 and the terminals 19a, 19b and 19c of the PBR 19 to be inserted therethrough, respectively.

Partition walls 36 and 37 continuing to the edges 35a and 35b and rising perpendicularly toward the top wall 29 from the ends 35a and 35b are formed at end edges 35b of the partition plate 35 opposed to the lower edge 33 of the short-side wall portion 33a and the edge 35a of the partition plate 35 opposed to the lower edge 32c, respectively. In central portions of the upper edge portion 36a and the upper edge portion 37a of the partition wall 37 are formed engaging portions 42 to be engaged with engaging pawls 41 of the cover member 50 as mentioned later.

A partition chamber 38 is defined by the partition plate 35 and the partition walls 36 and 37 such that the chamber is separated from the other portion of the upper housing member 30 and opened outside the upper housing member.

The cover member 50 has such a dimension that the partition chamber 38 formed in the upper housing member 30 may be closed with the cover member. The cover member 50 has a top wall 44 and a peripheral wall 45 extending downward from a peripheral edge 44a of the top wall 44. The top wall 44 is formed with the engaging pawls 41 in locations corresponding to the engaging portions 42 formed at the upper housing member 30, while projecting from the peripheral edge 44a of the top wall 44.

When the actuator 10 is assembled, the motor 15, the power-transmitting mechanism 17, the PBR 19, the motor connector 21 and the input connector 23 are arranged in the lower housing member 20, and then the upper housing member 30 is attached to the lower housing member 20. By this attachment, the lower edge 31 of the upper housing member 30 is butted to the upper edge 13a of the lower housing member 20. Further, the projecting plate portion 43 formed at the upper housing member 30 is attached into the cutaway portion 14 formed in the lower housing member 20. By this construction, the upper housing member 30 is attached to the lower housing member 20 precisely at a predetermined attachment position.

By this engagement, the motor connector 21, the power input connector 23 and the terminals 19a, 19b and 19c of the PBR 19 arranged in the lower housing member 20 are inserted through the openings 39a, 39c and 39b formed in the partition plate 35, respectively. By this, the terminals 21a of the connector 21, the terminals 23a of the connector 23 and the terminals 19a, 19b and 19c of the PBR 19 are exposed inside the partition chamber 38 through the openings 39a, 39b and 39c, respectively.

The circuit board 40 is placed on the partition plate 35 to cover the terminals 21a of the connector 21, those 23a of the connector 23 and those 19a, 19b and 19c of the PBR 19, which are exposed inside the partition chamber 38 through the openings 39a, 39b and 39c of the partition plate 35, respectively. As mentioned above, the terminals 21a, 23a and 19a, 19b and 19c are connected to the corresponding connection terminals 40a of the circuit board 40 on the partition plate 35 by soldering. In soldering, as well known, an insulating flux, for example, may be used as an auxiliary agent for facilitating the soldering and assuredly fixing the solder onto the circuit board 40.

Since the terminals 21a, 23a and 19a, 19b and 19c are connected to the connection terminals 40a of the circuit board 40 inside the partition chamber 38, the partition plate 35 and the partition walls 36 and 37 defining the partition chamber 38 function as an invasion-preventing cover conventionally used. Therefore, solder balls and flux scattering during soldering will not enter the lower housing member 20.

Thereafter, the cover member 50 is attached to the partition chamber 38 so as to cover the circuit board 40 to which the terminals 21a, 23a and 19a, 19b and 19c are soldered. By this attachment, the engaging pawls 41 formed at the cover member 50 are engaged with the engaging portions 42 formed in the partition walls 36 and 37, respectively. By this engagement, the cover member 50 is attached to the partition chamber 38 at such a closing location as to assuredly close the partition chamber 38.

The top wall 44 and the peripheral wall 45 of the cover member 50 are in flush with the top wall 29 and the peripheral wall 31 of the upper housing member 30 in the state that the cover member 50 is attached to the partition chamber 38.

In this embodiment, as mentioned above, the partition chamber 38 is defined in the upper housing member 30 by the partition plate 35 and the partition walls 36 and 37, and the circuit board 40 is arranged on the partition plate 35. By so constructing, the partition plate 35 and the partition walls 36 and 37 function as an invasion-preventing cover conventionally used. Therefore, solder balls and flux scattering during soldering can be assuredly prevented from entering the lower housing member 20, without placing such a conventional invasion-preventing cover over the motor 15, the power-transmitting mechanism 17, etc. arranged in the lower housing member 20 during soldering or cleaning the circuit board 40 after the soldering.

Further, the number of the producing steps can be reduced, and increase in the production cost can be suppressed through the formation of the partition chamber 38 by eliminating the conventional need to use the invasion-preventing cover during soldering or cleaning the circuit board 40 after the soldering.

Furthermore, since the partition chamber 38 is closed by attaching the cover member 50 to the partition chamber 38, the cover member 50 can function as the housing in corporation with the lower housing member 20 and the upper housing member 30 as in the conventional housing in which the motor 15, the power-transmitting mechanism 17, etc. are housed. Furthermore, dust can be assuredly prevented from being deposited upon the circuit board 40 arranged on the partition plate 35 by closing the partition chamber 38 with the attachment of the cover member 50 thereto.

In this embodiment, the partition plate 35 is formed with the openings 39a, 39b and 39c in locations corresponding to the motor connector 21, the power input connector 23 and the terminals 19a, 19b and 19c of the PBR 19, respectively, the motor connector 21, the power input connector 23 and the terminals 19a, 19b and 19c of the PBR are inserted through these respective openings when the upper housing member 30 is attached to the lower housing member 20. In place of the formation of the above openings, insertion holes are formed in the partition plate 35 at locations corresponding to the terminals 21a, 23a, 19a, 19b and 19c of the connectors 21 and 23 and the PBR 19, respectively, in such a dimension as to allow insertion of only the terminals therethrough.

Moreover, in this embodiment, although the partition chamber 38 is formed in the corner of the upper housing member 30, the place where the partition chamber 38 is formed can be arbitrarily varied depending upon the arranging places of the connectors 21 and 23 and the terminals 19a, 19b and 19c of the PBR 19 inside the lower housing member 20. In addition, when each of the lower housing member 20 and the upper housing member 30 has a spherical shape as viewed sectionally in plane, each of the partition walls and the partition plate constituting the partition chamber 30 may be designed in a fan-like shape, for example.

When the terminals 21a, 23a and 19a, 19b and 19c of the connectors 21 and 23 and the PBR 19, respectively are soldered to the connection terminals 40a of the circuit board 40, the solder is not limited to only a common solder such as Sn-Pb based solder, but various solders such as a so-called Pb-free solder containing no Pb may be used.

What is claimed is:

1. An actuator, comprising:
   a lower housing member;
   an upper housing member attached to said lower housing member;
   a driving source arranged in the lower housing member;
   a power-transmission mechanism arranged in the lower housing member, and configured for transmitting a driving power of said driving source to an output shaft to which a member to be driven is attached;
   a connector arranged in the lower housing member, and having terminals projecting therefrom;
   a partition chamber provided in said upper housing member, defined by a partition plate and a plurality of partition walls rising from said partition plate, said partition chamber opened to an outside of said upper housing member and separated from said lower housing member;
   a circuit board arranged on said partition plate, and having a control circuit for said driving source; and
   a cover member covering said circuit board arranged on said partition plate, and closing said partition chamber, wherein
   said partition plate has an opening for exposing said terminals of the connector into said partition chamber, said circuit board has connection terminals connected to said terminals of the connector, which are exposed through said opening of said partition plate, with a solder in said partition chamber.

2. The actuator set forth in claim 1, wherein said connector comprises a driving source connector and a power input connector which have respective terminals connected to said connection terminals of the circuit board with the solder.

3. The actuator set forth in claim 1, which further comprises a potentiobalance resistor having terminals exposed into said partition chamber through said opening formed in the partition plate and connected to said connection terminals of the circuit board.

4. The actuator set forth in claim 2, which further comprises a potentiobalance resistor having terminals exposed into said partition chamber through said opening formed in the partition plate and connected to said connection terminals of the circuit board.

* * * * *